US009773636B2

(12) United States Patent
Lee et al.

(10) Patent No.: US 9,773,636 B2
(45) Date of Patent: Sep. 26, 2017

(54) APPARATUS AND METHOD FOR GENERATING HIGH CURRENT NEGATIVE HYDROGEN ION BEAM

(71) Applicant: Varian Semiconductor Equipment Associates, Inc., Gloucester, MA (US)

(72) Inventors: W. Davis Lee, Newburyport, MA (US); Neil Bassom, Hamilton, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/831,468

(22) Filed: Aug. 20, 2015

(65) Prior Publication Data

US 2017/0053776 A1  Feb. 23, 2017

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/082* (2013.01); *H01J 2237/31701* (2013.01)

(58) Field of Classification Search
CPC .. H01J 37/08; H01J 37/3171; H01J 2237/082; H01J 2237/31701
See application file for complete search history.

(56) References Cited

U.S. PATENT DOCUMENTS

| 4,140,576 A  *  | 2/1979  | Fink ......................... H05H 1/22 |
| --- | --- | --- |
|  |  | 250/251 |
| 4,176,025 A  * | 11/1979 | Chen ...................... B01D 59/34 |
|  |  | 204/157.21 |
| 4,407,705 A  * | 10/1983 | Garscadden ........... B01J 19/085 |
|  |  | 204/157.22 |
| 2013/0255577 A1* | 10/2013 | Chang ..................... H01J 37/08 |
|  |  | 118/723 R |

* cited by examiner

*Primary Examiner* — Jack Berman

(57) ABSTRACT

An apparatus to generate negative hydrogen ions. The apparatus may include an ion source chamber having a gas inlet to receive $H_2$ gas; a light source directing radiation into the ion source chamber to generate excited $H_2$ molecules having an excited vibrational state from at least some of the $H_2$ gas; a low energy electron source directing low energy electrons into the ion source chamber, wherein $H^-$ ions are generated from at least some of the excited $H_2$ molecules; and an extraction assembly arranged to extract the $H^-$ ions from the ion source chamber.

13 Claims, 3 Drawing Sheets

APPARATUS AND METHOD FOR GENERATING HIGH CURRENT NEGATIVE HYDROGEN ION BEAM

FIELD

Embodiments relate to the field of ion generation. More particularly, the present embodiments relate to a method for producing a hydrogen beam for proton ion implantation.

BACKGROUND

Ions, including positive ions, are widely used to process electronic devices, optical devices, micro-electromechanical devices (MEMS), as well as to treat materials to alter material properties. Positive ions are readily generated using a variety of apparatus including beamline ion implanters, compact ion apparatus, including plasma immersion devices, and the like.

For high energy implantation, typically 300 kV or greater, tandem acceleration is often used to generate ions of a target energy. Often, tandem acceleration is applied to ions, such as hydrogen ions, in order to generate sufficiently high energy for ions to implant to a desired depth into a substrate. In a tandem acceleration process, an electrostatic accelerator may accelerate negative hydrogen ions generated in an ion source from ground potential up to a positive high-voltage terminal. The electrons on the negative hydrogen ions are then stripped from the negative ion by passage through a charge exchange region, and resulting positive hydrogen ion (proton) is again accelerated as the proton passes to ground potential from the high positive potential. The protons emerge from the tandem accelerator with twice the energy of the high positive voltage applied to the tandem accelerator.

One problem encountered when producing high energy hydrogen ion beams for ion implantation, is the relatively low ion current produced by an ion source generating negative hydrogen ions, placing a limit on throughput of substrates to be implanted with high energy hydrogen. In view of the above, the embodiments of the present disclosure are presented.

BRIEF SUMMARY

This Summary is provided to introduce a selection of concepts in a simplified form where the concepts may be further described below in the Detailed Description. This Summary is not intended to identify key features or essential features of the claimed subject matter, nor is the summary intended as an aid in determining the scope of the claimed subject matter.

In one embodiment, an apparatus to generate negative hydrogen ions may include an ion source chamber having a gas inlet to receive $H_2$ gas. The apparatus may also include a light source directing radiation into the ion source chamber to generate excited $H_2$ molecules having an excited vibrational state from at least some of the $H_2$ gas; a low energy electron source directing low energy electrons into the ion source chamber, wherein $H^-$ ions are generated from at least some of excited $H_2$ molecules; and an extraction assembly arranged to extract the $H^-$ ions from the ion source chamber.

In another embodiment, an ion implantation system to generate a proton beam may include a negative ion source operative to generate negative hydrogen ions. The negative ion source may include an ion source chamber having a gas inlet to receive $H_2$ gas; a light source directing radiation into the ion source chamber to generate excited $H_2$ molecules having an excited vibrational state from at least some of the $H_2$ gas; a low energy electron source directing low energy electrons into the ion source chamber, wherein $H^-$ ions are generated from at least some of excited $H_2$ molecules; and an extraction assembly arranged to extract the $H^-$ ions from the ion source chamber. The ion implantation system may further include a tandem accelerator to convert the $H^-$ ions into a beam of protons.

In a further embodiment, a method for generating a hydrogen ion beam may include providing molecular hydrogen gas to an ion source chamber, exposing the molecular hydrogen gas to radiation, wherein at least a fraction of the molecular hydrogen gas is changed to excited $H_2$ species having an excited vibrational state, directing low energy electrons into the excited hydrogen gas, wherein at least some of the excited $H_2$ species forms $H^-$ ions, and extracting the $H^-$ ions from the ion source chamber to form a beam of negative hydrogen ions.

DETAILED DESCRIPTION

Embodiments disclosed herein provide improved negative ion current sources, implanters, and high efficiency techniques for generating negative hydrogen ions. In various embodiments, an improved negative hydrogen ion source is disclosed, as well as techniques to improve negative hydrogen ion sources. In some embodiments, a high energy proton (hydrogen) ion implantation system may employ a high negative hydrogen ion source providing a higher hydrogen ion current as compared to conventional ion implantation systems.

Figure 1:
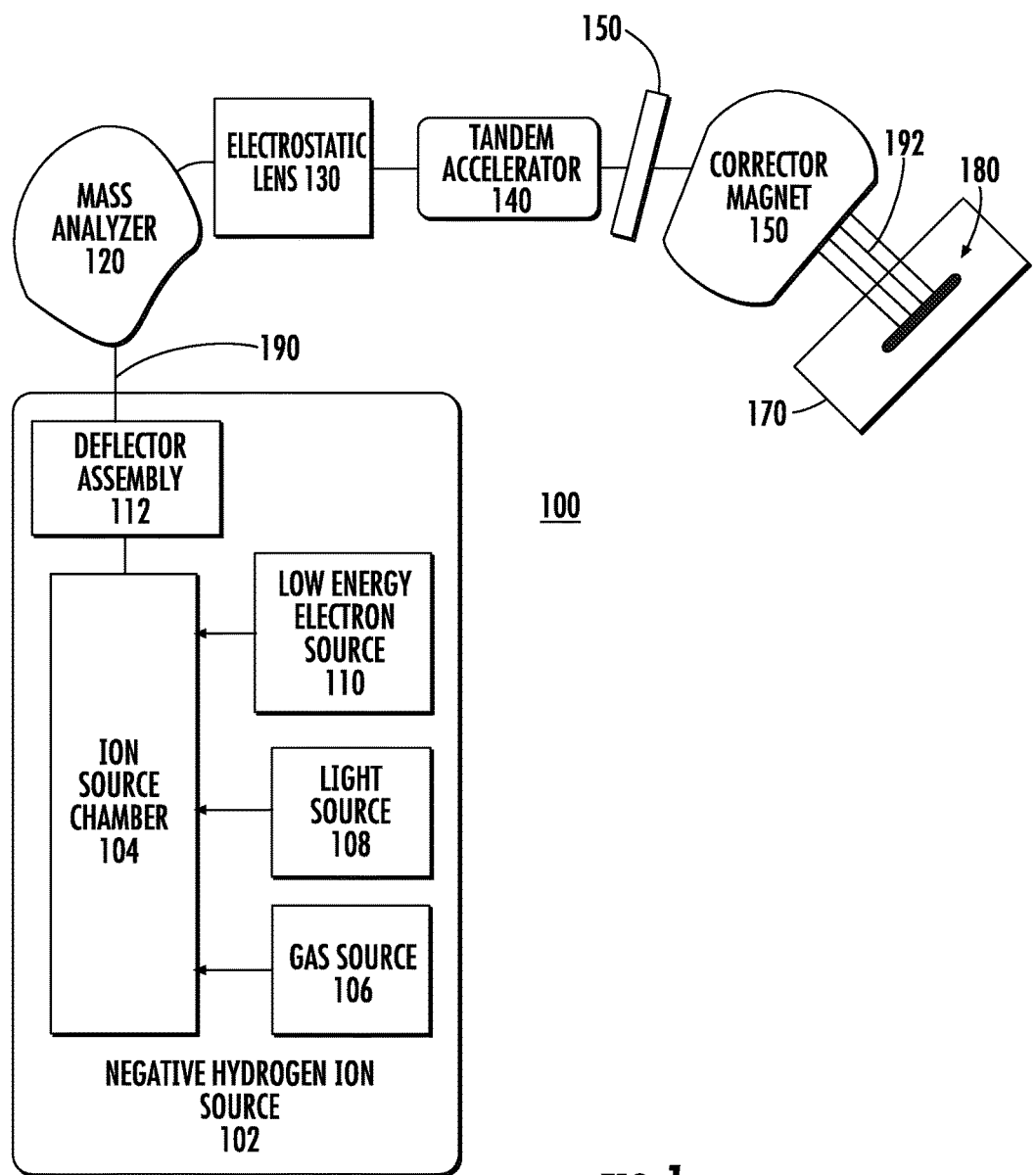
FIG. 1 depicts an ion implantation system arranged according to embodiments of the disclosure.

FIG. 1 depicts an ion implantation system 100 arranged according to embodiments of the disclosure. The ion implantation system 100 may include a negative hydrogen ion source 102, capable of generating a negative hydrogen ion beam 190. The negative hydrogen ion source 102 provides improved apparatus for generating enhanced negative hydrogen ion current. This may be useful to increase dose rate of hydrogen in a substrate to be implanted, improving substrate throughput. The ion implantation system 100 may further include known components including a mass analyzer 120, for providing a mass analyzed beam by deflecting and filtering the negative hydrogen ion beam 190. As illustrated in FIG. 1, the ion implantation system may include an electrostatic lens 130 and tandem accelerator 140. The tandem accelerator 140 may be a known tandem accelerator arranged to receive the negative hydrogen ion beam 190 and output a positive hydrogen ion beam 192, such as a proton beam. In so doing, the energy of the hydrogen ion beam may be increased as in known tandem accelerators. The ion implantation system may further include a scanner 145, corrector magnet 150, end station 170, and substrate platen 180.

As further shown in FIG. 1, components of the negative hydrogen ion source 102 are depicted in schematic block form. The negative hydrogen ion source 102 may provide a novel assembly of components to generate a negative hydrogen ion beam in a novel manner, allowing for increased negative ion current density as compared to known ion sources. The negative hydrogen ion source 102 may include an ion source chamber 104, a gas source 106, light source 108, low energy electron source 110, and deflector assembly 112. The gas source 106 may include molecular hydrogen ($H_2$) and may deliver the molecular hydrogen to the ion source chamber 104 via a gas inlet. The light source 108 may direct radiation into the ion source chamber 104, where the radiation is electromagnetic radiation having a target energy to excite the molecular hydrogen, as described below. The light source 108 may generate radiation over a range of photon energies, discrete photon energies, or a single photon energy. In some embodiments, the light source 108 may generate a photon energy of its photons of at least 1.5 eV, and in particular embodiments, a photon energy of 2.5 eV to 2.6 eV. The embodiments are not limited in this context.

The low energy electron source 110 may direct low energy electrons into the ion source chamber 104 to ionize hydrogen gas within the ion source chamber 104. In various embodiments, the low energy electron source 110 may generate low energy electrons, meaning electrons having an energy of less than approximately 4.0 eV. In particular embodiments, the low energy electron source 110 may be arranged to generate electron energy in the range of 0.5 eV to 3.0 eV. As detailed below, the electron energy or electron energies provided by the low energy electron source 110, may be selected to generate a relatively high yield of negative ions.

As detailed below, the deflector assembly 112 may be coupled to the ion source chamber 104 to receive hydrogen ions and output a negative hydrogen ion beam, shown as negative hydrogen ion beam 190 in FIG. 1.

Figure 2A:
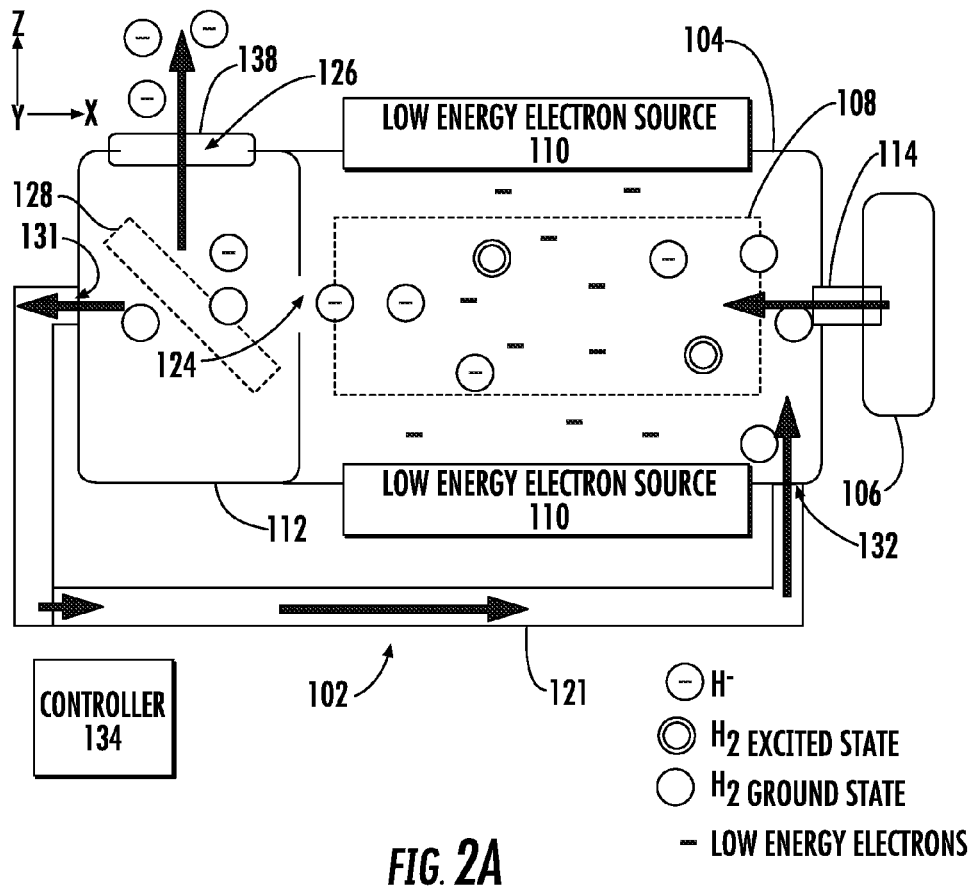
FIG. 2A depicts details of a negative hydrogen ion source of FIG. 1 according to various embodiments of the disclosure.
Figure 2B:
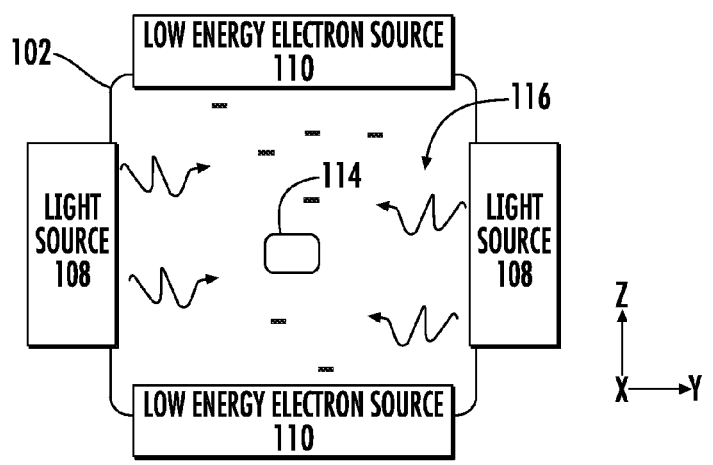
FIG. 2B presents an end view of an ion source chamber of the negative hydrogen ion source of FIG. 2A.

FIG. 2A depicts details of the negative hydrogen ion source 102, according to various embodiments of the disclosure. In particular, FIG. 2A presents a side view of an arrangement of the ion source chamber 104 and deflector assembly 112, while FIG. 2B presents an end view of the ion source chamber 104. The relative orientation between the different views is shown by the Cartesian coordinate system. In various embodiments, the ion source chamber 104 may have a cylindrical shape, a shape in a rectangular prism, or other shape. The embodiments are not limited in this context. In the embodiment shown in FIGS. 2A and 2B, the ion source chamber 104 may have a generally rectangular prism shape.

As illustrated in FIG. 2A, the gas source 106 may be coupled to the ion source chamber 104 via a gas inlet 114. The gas inlet 114 may provide $H_2$ gas in an unexcited, ground state, to the ion source chamber 104, for example, as indicated by the open circles. As the $H_2$ gas traverses the ion source chamber 104, the light source 108 may direct radiation 116 into the ion source chamber 104, as illustrated in FIG. 2B. At least some of the $H_2$ gas in the ground state may be excited by the radiation 116, resulting in $H_2$ gas in an excited state, as shown by the double circles. The light source 108 may be external to the ion source chamber 104, may be arranged adjacent a surface of the ion source chamber 104, may be embedded at least partially in a wall of the ion source chamber 104, or may be located at least partially within the ion source chamber 104. The light source 108 may extend along at least one side of the ion source chamber 104, as shown in FIG. 2A and FIG. 2B. More particularly, the light source 108 may be arranged as multiple light sources, arranged along different sides of the ion source chamber 104, as illustrated in FIG. 2B. This arrangement may facilitate generation of an appropriate level of radiation to excite the hydrogen gas.

As further shown in FIGS. 2A and 2B the low energy electron source 110 may be arranged along a side, or multiple sides, of the ion source chamber 104. For example, the low energy electron source 110 may be arranged along a first pair of sides, while the light source 108 is arranged along a second pair of sides, as shown in FIG. 2B. The embodiments are not limited in this context. The low energy electron source 110 may be any convenient electron source, including known sources such as, a thermionic source, or a photoelectric emitter, and may include electrodes or other components to accurately define the energy of the electrons emitted from the low energy electron source 110. As shown in FIG. 2A, the low energy electron source 110 may emit low energy electrons into the ion source chamber 104 over a given area or length of the ion source chamber 104. According to various embodiments, the low energy electrons may attach to the $H_2$ gas in an excited state in an efficient manner, generating $H^-$ ions as shown. As detailed below, by proper choice of the energy of photons emitted by light source 108 and of the electron energy of low energy electrons emitted by the low energy electron source, the yield of $H^-$ ions may be increased in comparison to known methods.

The configuration of light sources and low energy electron sources in FIGS. 2A and 2B is exemplary. In other configurations, a light source 108 may be arranged opposite (facing) a low energy electron source 110. In a particular configuration, a light source 108 and low energy electron source 110, may be arranged facing one another along a first pair of opposite sides of the ion source chamber 104. For example, the low energy electron source 110, may be arranged along the top while the light source 108 is arranged along the bottom. In this configuration, a light source 108 and low energy electron source 110 may also be arranged facing one another along a second pair of opposite sides of the ion source chamber 104, such as the light source 108 disposed on the left side and low energy electron source 110 disposed on the right side, as viewed in FIG. 2B. The embodiments are not limited in this context.

In various embodiments, extraction of ion current from the negative hydrogen ion source 102 may take place via the deflector assembly 112. The deflector assembly 112 may form part of the ion source chamber 104 in some embodiments, or may be adjacent the ion source chamber 104. In the embodiment of FIG. 2A, the deflector assembly 112 may include an entrance aperture 124 to receive gaseous species, including neutral unexcited gas, excited molecules, or ions. The deflector assembly 112 may further include an extraction aperture 126, where the extraction aperture 126 outputs $H^-$ ions as shown. The deflector assembly may further include a magnetic deflector or electrostatic deflector, shown generally as the deflector 128. The deflector 128 may be arranged to deflect ions, such as monatomic hydrogen ions received through the entrance aperture 124 to the extraction aperture 126. The deflector 128 may include known components for accelerating and deflecting chosen ions such as $H^-$ ions, so as to direct the chosen ions to the extraction aperture 126, where the $H^-$ ions may be extracted as an ion beam. An extraction assembly 138 having one or more electrodes, may define the extraction aperture 126, as shown. The extraction assembly 138 may form part of the ion source chamber 104, or part of the deflector assembly 112.

The negative hydrogen ion source 102 may also include a recirculation line 121 having an inlet 131 connected to the deflector assembly 112, or to the ion source chamber to receive neutral hydrogen gas, and an outlet 132 connected to the ion source chamber 104 to discharge the neutral hydrogen gas into the ion source chamber 104.

As further shown in FIG. 2B, a controller 134 may be provided comprising logic to adjust electron energy of the low energy electrons to increase or maintain the ionization efficiency of $H_2$ gas.

In various embodiments, using an apparatus such as the negative hydrogen ion source 102, the combination of photon energy of radiation and electron energy of low energy electrons directed to hydrogen gas is arranged to efficiently generate negative hydrogen ions. In a first operation, a light source may direct radiation having an energy to excite a given vibrational state, or states, of diatomic hydrogen ($H_2$). Various excited vibrational states of hydrogen are known, representing higher energy states than ground state of a $H_2$ molecule. Accordingly, the term "excited vibrational state" as used herein may refer to a vibrational state of $H_2$ molecule higher than the ground state of vibration of $H_2$ molecule. A given excited vibrational state may be generated when energy, such as electromagnetic radiation, is absorbed by a $H_2$ molecule in the ground state. For a given excited vibrational state corresponding to $v=3, 4, 5$, and so forth, if a photon has an energy corresponding to the difference between the excited vibrational state and ground state, a hydrogen molecule may absorb the photon energy, resulting in promotion of the hydrogen molecule to the excited vibrational state. In this manner, light having a select photon energy may be used to pump hydrogen molecules from the ground state to a chosen excited vibrational state.

In accordance with some embodiments, the photon energy may be selected to generate excited vibrational states such as $v=5$, or $v=4$. The embodiments are not limited in this context. Because the transition between a ground state and excited vibrational state is quantized, in some embodiments, a photon having an energy matching the energy difference between the ground state and the given excited vibrational state may be selected to increase the likelihood of a ground state hydrogen molecule absorbing the photon and is promoted to the given excited vibrational state.

As an example, the $v=5$ state corresponds to a photon energy of 2.56 eV (wavelength ~480 nm), while the $v=4$ state corresponds to a photon energy of 2.16 eV (wavelength ~580 nm). These two excited vibrational states may accordingly be excited by use of a light source or light sources having radiation within the middle of the visible range (480 nm or 580 nm).

In some embodiments, a mono chromatic light source generating 2.56 eV radiation may be employed as light source 108 to generated hydrogen molecules in the $v=5$ excited vibrational state. In particular embodiments, the light source 108 may be a light-emitting diode (LED) outputting radiation having an energy of approximately 2.56 eV. In particular embodiments, the light source 108 may be a light amplification by stimulated emission of radiation (LASER) outputting radiation having an energy of approximately 2.56 eV. In other embodiments, a broad spectrum light source may be used as light source 108, where the light source 108 may simultaneously pump different ground state hydrogen molecules into different excited vibrational states, such as $v=7, v=6, v=5, v=4, v=3$, and so forth. In particular, the broad spectrum light source may generate photons having an energy meeting a threshold energy to threshold energy to promote the $H_2$ gas to an excited vibrational state, or to more than one excited vibrational state.

Additionally, $H_2$ has a higher ionization cross-section for attachment of an electron to form a negative ion when the molecule is an excited vibrational state, such as $v=7, v=6, v=5$, or $v=4$ as compared to unexcited $H_2$ molecules or $H_2$ molecules in the $v=2$, or $v=1$ excited vibrational state. This process of ionization may be referred to as dissociative electron attachment where an $H_2$ molecule acquires an electron to form an $H_2^-$ ion and subsequently decays to H and $H^-$ species. In particular, when an electron of a given electron energy interacts with a $H_2$ molecule, the electron may have a certain probability for ionizing the $H_2$ molecule to form a negative ion. The dissociative electron attachment ionization process may be represented as

$$H_2(v_i) + e \rightarrow H_2^- \qquad \text{(R1); and}$$

$$H_2^- \rightarrow H^- + H \qquad \text{(R2).}$$

Once a negative $H_2^-$ ion is formed, the decay to $H^-$ and H may take place readily since $H_2^-$ is an unstable ion. The probability of generating dissociative electron attachment, in other words, the probability of creating a negative hydrogen ion, is proportional to the dissociative electron attachment (ionization) cross-section for $H_2$ molecules in a given vibrational state ($v_i$). As an example, the dissociative electron attachment cross-section for $H_2$ molecules in the $v=5$ excited vibrational state ($H_2$, $v=5$ state) has been calculated to be approximately 1 Å$^2$. The phenomenon of dissociative electron attachment for ionizing an $H_2$ molecule is characterized by the maximum cross-section occurring at a threshold electron energy. Below the threshold electron energy, the cross-section is zero, meaning ionization by electron attachment does not take place. Above the threshold value, the cross-section decreases monotonically with increased electron energy. For example, in the $H_2$, $v=5$ state the threshold electron energy has been calculated to be 1.44 eV where the cross-section equals a maximum of 1 Å$^2$ (1×10$^{-20}$ m$^2$). This value is approximately the same at 1.5 eV and decreases to approximately 0.4 Å$^2$ at 2.0 eV electron energy and to 0.1 Å$^2$ at 2.5 eV. Similarly, in the $H_2$, $v=4$ state, the threshold electron energy has been calculated to be 1.82 eV where the cross-section equals a maximum of approximately 0.4 Å$^2$. This value decreases to approximately 0.08 Å$^2$ at 2.5 eV. In contrast, the $H_2$, $v=0$ state for unexcited $H_2$ molecules has a threshold electron energy calculated to be 3.72 eV where the cross-section equals a maximum of just 2×10$^{-5}$ Å$^2$.

Accordingly, the present embodiment provide a technique to greatly increase the chances of ionizing an $H_2$ molecule by first pumping the molecule to an excited vibrational state using a light source. In this manner, and given an appropriate choice of electron energy, the cross-section for dissociative electron attachment may be increased by many orders of magnitude with respect to unexcited $H_2$.

In additional embodiments, light generating higher energy photons may be provided to an ion source. For example, 2.94 eV photons may be directed to $H_2$ gas in an ion source chamber to excite $H_2$ molecules, generating excited $H_2$ species having the $v=6$ state. The energy of electrons directed to such excited $H_2$ species may accordingly be reduced in order to provide electrons at an energy where the cross-section for dissociative electron attachment (ionization) is higher. For example, an estimate of the cross-section for dissociative electron attachment for $H_2$ molecules excited in the $v=6$ state by ~1.0 eV electrons is ~3 A$^2$. Similarly, 3.28 eV photons may be directed to $H_2$ gas in an ion source chamber to excite the $v=7$ state, where the maximum cross-section for dissociative electron attachment may be even higher. There are multiple considerations in ion source design placing limits on the approach of increasing the photon energy for exciting $H_2$ gas while decreasing the electron energy for ionizing the excited gas. One consideration is the type of light source to be employed. For example, 3.28 eV photons have a wavelength of 376 nm, placing such radiation in the ultraviolet range. Additionally, the electron energy where dissociative electron attachment is greatest for $H_2$, v=7 molecules is less than 1.0 eV. This low energy places a demand to set and control electron energy from an electron source at the level of tenths of an electron volt.

According to calculations, an ion source arranged in accordance with the above embodiments, may be constructed to achieve a target level of ion source current density of, for example, 0.1 $Am^{-1}$ using a photon power flux of 1200 W/m, for example, where to photon power flux is measured in terms of the length of a light source extending along a chamber length parallel to the X-axis in FIG. 2A.

Figure 3:
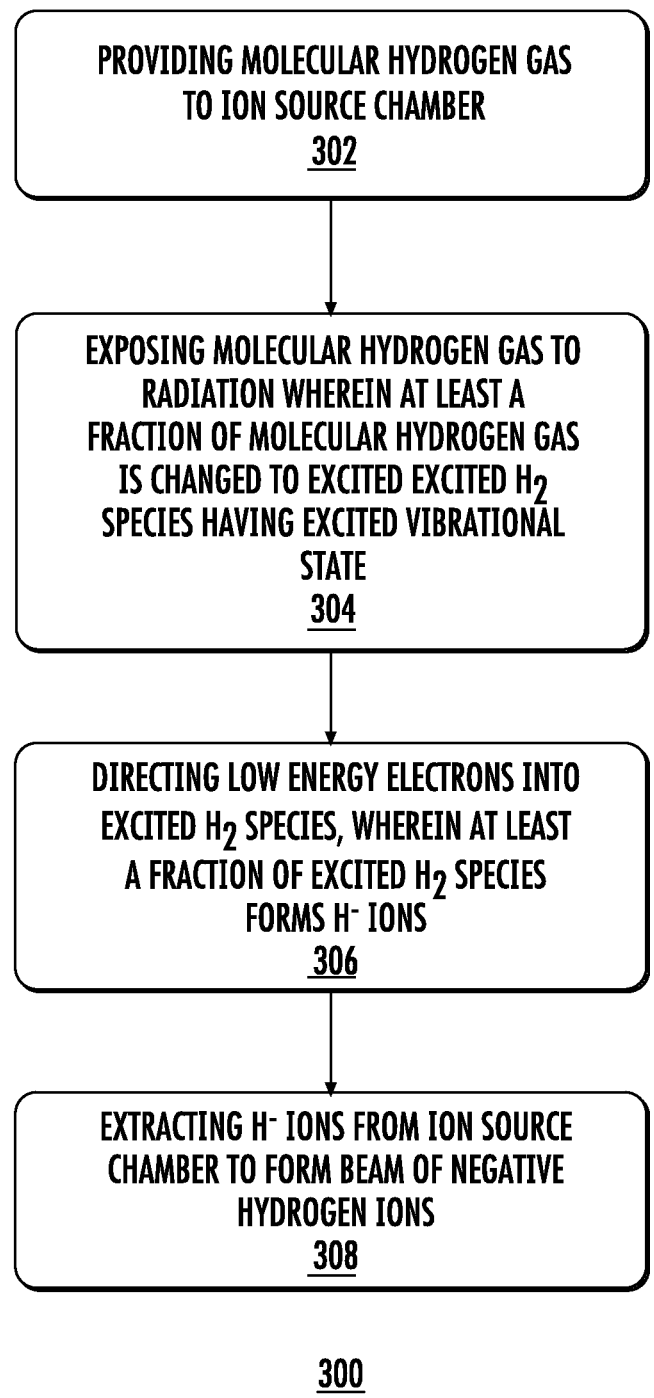
FIG. 3 depicts an exemplary process flow according to embodiments of the disclosure.

FIG. 3 depicts an exemplary process flow 300. At block 302, the operation of providing molecular hydrogen gas to an ion source chamber, is performed. At block 304, the molecular hydrogen gas is exposed to radiation wherein at least a fraction of the molecular hydrogen gas is changed to excited $H_2$ species having an excited vibrational state. In some embodiments, the photon energy of the radiation may be at least 1.5 eV, wherein excited the excited vibrational state corresponds to v=3 or v>3.

At block 306, low energy electrons are directed into the excited $H_2$ species, wherein at least a fraction of the excited $H_2$ species forms $H^-$ ions. At block 308, the $H^-$ ions are extracted from the ion source chamber to form a beam of negative hydrogen ions.

In summary, apparatus and methods to produce high negative hydrogen ion current are disclosed. Advantages include the ability to generate a high negative hydrogen ion current using a novel ion source having a light source having a readily achievable power output. Another advantage is the ability to generate high negative hydrogen ion current without using charge exchange apparatus.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although the embodiments detailed above describe the production of high negative hydrogen ion current for ion implantation purposes, the present embodiments cover any application where a high current of negative hydrogen ions may be applied. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize the usefulness is not limited thereto and the embodiments of the present disclosure may be beneficially implemented in any number of environments for any number of purposes. Thus, the claims set forth below should be construed in view of the full breadth and spirit of the present disclosure as described herein.

What is claimed is:

1. An apparatus to generate negative hydrogen ions, comprising:

an ion source chamber having a gas inlet to receive $H_2$ gas;

a light source directing radiation into the ion source chamber to generate excited $H_2$ molecules having an excited vibrational state from at least some of the $H_2$ gas;

a low energy electron source directing low energy electrons into the ion source chamber, wherein $H^-$ ions are generated from at least some of the excited $H_2$ molecules; and an extraction assembly arranged to extract the $H^-$ ions from the ion source chamber, wherein the light source is embedded at least partially in a wall of the ion source chamber, or is disposed within the ion source chamber, the low energy electron source generating low energy electrons having an electron energy between 1.5 eV and 2.0 eV, the light source comprising radiation having a photon energy of 2.5 eV to 2.6 eV.

2. The apparatus of claim 1, the light source extending along a first side of the ion source chamber and along a second side of the ion source chamber.

3. The apparatus of claim 1, the low energy electron source extending along a third side of the ion source chamber and along a fourth side of the ion source chamber.

4. The apparatus of claim 1, the light source comprising a light-emitting diode, a laser, or a broad spectrum light source generating photons having energy meeting a threshold energy to promote the $H_2$ gas to the excited vibrational state.

5. The apparatus of claim 1, further comprising a gas source comprising molecular hydrogen gas and coupled to the gas inlet.

6. The apparatus of claim 1, further comprising a deflector assembly, the deflector assembly comprising a magnetic deflector or electrostatic deflector arranged to deflect monatomic hydrogen ions received from the ion source chamber to an extraction aperture of the extraction assembly.

7. The apparatus of claim 6, further comprising a recirculation line having an inlet connected to the deflector assembly to receive neutral hydrogen gas, and an outlet connected to the ion source chamber to discharge the neutral hydrogen gas into the ion source chamber.

8. The apparatus of claim 1, further comprising a controller comprising logic to adjust electron energy of the low energy electrons.

9. An ion implantation system to generate a proton beam, comprising:

a negative ion source operative to generate negative hydrogen ions, the negative ion source comprising:

an ion source chamber having a gas inlet to receive $H_2$ gas;

a light source directing radiation into the ion source chamber to generate excited $H_2$ molecules having an excited vibrational state from at least some of the $H_2$ gas;

a low energy electron source directing low energy electrons into the ion source chamber, wherein $H^-$ ions are generated from at least some of excited $H_2$ molecules, wherein the light source is embedded in a wall of the ion source chamber, or is disposed within the ion source chamber, the low energy electron source generating low energy electrons having an electron energy between 1.5 eV and 2.0 eV, the light source comprising radiation having a photon energy of 2.5 eV to 2.6 eV;

an extraction assembly arranged to extract the $H^-$ ions from the ion source chamber; and a tandem accelerator to convert the $H^-$ ions into a beam of protons.

10. The ion implantation system of claim 9, the ion source chamber having a chamber length in meters (m), wherein the negative ion source generates an ion source current density of H$^-$ ions of 0.1 Am$^{-1}$.

11. A method for generating a hydrogen ion beam, comprising:
   providing molecular hydrogen gas to an ion source chamber;
   exposing the molecular hydrogen gas to radiation from a light source wherein at least some of the molecular hydrogen gas is changed to excited H$_2$ species having an excited vibrational state, and wherein the light source is embedded in a wall of the ion source chamber, or is disposed within the ion source chamber;
   directing low energy electrons into the excited H$_2$ species, wherein at least a fraction of the excited H$_2$ species forms H$^-$ ions, the low energy electron source generating low energy electrons having an electron energy between 1.5 eV and 2.0 eV, the light source comprising radiation having a photon energy of 2.5 eV to 2.6 eV; and
   extracting the H$^-$ ions from the ion source chamber to form a beam of negative hydrogen ions.

12. The method of claim 11, wherein the excited vibrational state is a vibrational state of v=3 or v>3.

13. The method of claim 11, further comprising deflecting the H$^-$ ions from an initial trajectory to a final trajectory before the extracting the H$^-$ ions.

\* \* \* \* \*